United States Patent [19]

Schwent et al.

[11] Patent Number: 5,060,294
[45] Date of Patent: Oct. 22, 1991

[54] DUAL MODE POWER AMPLIFIER FOR RADIOTELEPHONE

[75] Inventors: Dale G. Schwent, Hoffman Estates; Rashid M. Osmani, Carol Stream; Gary M. Cristiano, Hoffman Estates, all of Ill.

[73] Assignee: Motorola, Inc., Schaumburg, Ill.

[21] Appl. No.: 548,807

[22] Filed: Jul. 5, 1990

[51] Int. Cl.$^5$ .......................... H03F 3/04; H04B 1/04
[52] U.S. Cl. .................................. 455/93; 307/296.1; 307/490; 330/296; 330/51; 455/127
[58] Field of Search ................. 455/93, 103, 107, 127; 330/296, 51, 3, 8, 282, 86, 110, 144; 307/490, 493, 300, 296.1; 455/341

[56] References Cited

U.S. PATENT DOCUMENTS

| | | |
|---|---|---|
| 4,034,308 | 7/1977 | Wermuth et al. ..................... 330/86 |
| 4,257,009 | 3/1981 | Yorkanis ............................... 330/51 |
| 4,446,440 | 5/1984 | Bell ....................................... 330/10 |
| 4,901,032 | 2/1990 | Komiak ................................ 330/277 |
| 4,924,191 | 5/1990 | Erb et al. ............................. 330/130 |
| 4,955,083 | 9/1990 | Phillips et al. ........................ 455/47 |

Primary Examiner—Curtis Kuntz
Assistant Examiner—Chi H. Pham
Attorney, Agent, or Firm—Robert H. Kelly

[57] ABSTRACT

A dual mode power amplifier operable in etiher the linear mode or the saturation mode. The power amplifier, when comprising a portion of a radio transmitter, permits efficient amplification of either a frequency modulated or a composite modulated signal by operation of the amplifier in the saturation mode or the linear mode, respectively. A processor determines the modulation-type of the signal and generates a signal to cause operation of the amplifier in either the saturation mode or the linear mode.

54 Claims, 6 Drawing Sheets

DUAL MODE POWER AMPLIFIER FOR RADIOTELEPHONE

BACKGROUND OF THE INVENTION

The present invention relates generally to amplifying apparatus, and, more particularly, to amplifying apparatus for efficiently amplifying both an analog, frequency modulated signal, and a composite modulated signal comprising both an amplitude modulated portion and a phase modulated portion.

Many communication systems transmit information between a transmitter and a receiver by modulating an information signal upon an electromagnetic wave.

Various techniques have been developed to modulate the information signal upon the electromagnetic wave to form thereby the modulated electromagnetic information signal. For instance, amplitude modulation, frequency modulation, and phase modulation are three modulation techniques frequently utilized to modulate an information signal upon the electromagnetic wave.

In general, an amplitude modulated signal is formed by modulating the information signal upon the electromagnetic wave such that the information signal modifies the amplitude of the electromagnetic wave corresponding to the value of the information signal. The frequency of the electromagnetic wave does not vary, and the information content of the modulated signal is contained in the shape, or amplitude, of the signal. A frequency modulated signal, conversely, is formed by altering the frequency of the electromagnetic wave corresponding to the value of the information signal. The amplitude of the electromagnetic wave does not vary, and the information content of the modulated signal is contained in the variation of the frequency of the signal. A phase modulated signal is formed by altering the phase, but not the frequency, of the electromagnetic wave corresponding to the value of the information signal. Similar to the amplitude of the frequency modulated signal, the amplitude of the electromagnetic wave does not vary. The information content of the phase modulated signal is contained in the variation of the phase of the signal. Because the amplitudes of frequency modulated signals and phase modulated signals do not vary, these modulated signals are referred to as constant envelope signals.

Receivers constructed to receive the modulated signals contain circuitry to detect, or to recreate, the information signal modulated upon the electromagnetic wave. This detection or recreation process is referred to as demodulation. Receivers are constructed to permit demodulation of signals modulated by the various modulation techniques.

The electromagnetic wave upon which the information signal is modulated is referred to as the carrier wave, and is characterized by the frequency thereof; such frequency is referred to as the carrier frequency. The information signal, once modulated upon the electromagnetic wave, is positioned, in frequency, close to, or centered about, the carrier frequency characterizing the electromagnetic wave. Modulated, electromagnetic information signals of different carrier frequencies may be transmitted simultaneously as long as the information signals modulated thereupon do not overlap in frequency.

Governmental, both national and international, regulatory authorities regulate the number of, location of, and transmission strength of signals transmitted at frequencies in various frequency bands of the frequency spectrum. Regulation of transmission is necessary to ensure that overlapping of simultaneously transmitted signals does not occur.

A one hundred megahertz band of the electromagnetic frequency spectrum (extending between 800 megahertz and 900 megahertz) is allocated in the United States for radiotelephone communication, such as, for example by the radiotelephones utilized in a cellular, communication system, wherein a modulated, electromagnetic information signal is transmitted between the radiotelephone and a base station.

A cellular, communication system is created by positioning numerous base stations at spaced-apart locations throughout a geographical area. Base stations receive and transmit information signals. Each base station receives the electromagnetic signals transmitted by the cellular, radiotelephone when the phone is located in the vicinity thereof. Each portion of the geographical area containing a base station is defined to be a cell. The electromagnetic information signal transmitted by the cellular, radiotelephone, when positioned in a particular cell, is received by the base station which defines that cell.

The cellular, radiotelephone modulates an information signal upon an electromagnetic wave to produce thereby the modulated electromagnetic information signal which is transmitted to at least one of the base stations positioned throughout the geographical area. The carrier frequency characterizing the electromagnetic wave upon which the information signal is modulated is of a value within the band allocated for radiotelephone transmission. The base station receives the transmitted electromagnetic information signal, and demodulates the signal. The base station, in turn, is connected, typically by a wire or a cable, to a conventional telephone system. The information signal, once demodulated from the electromagnetic information signal, is supplied by the base station to the telephone system to be transmitted therealong.

Transmission circuitry with each of the base stations modulates information signals upon carrier waves by a modulation technique, such as one described hereinabove, to permit transmission to the radiotelephones. Communication to and from the radiotelephones is thereby effectuated.

Simultaneous transmission of modulated electromagnetic information signals to and from numerous cellular, radiotelephones is possible by transmitting the electromagnetic information signals at various different frequencies throughout the allocated frequency band.

Increased usage of cellular, radiotelephones has resulted in a commensurate increase in the utilization of the frequency band allocated for radiotelephone communication. As a result, the allocated frequency band of many cells of various geographical areas has become saturated, as oftentimes, electromagnetic information signals are transmitted simultaneously throughout the entire frequency band. Other frequency bands allocated for other uses are similarly frequently saturated.

Various attempts have been made to increase the information-transmission capacity of cellular, radiotelephone communication systems. For example, increases in the number of base stations in a geographical area commensurately increases the number of cells defined thereby. Increasing the number of cells in a geographical area permits an increase in the number of signals which may be simultaneously transmitted within the geographical area. However, increases in the number of base stations positioned throughout a geographical area are limited by the interference between radio telephones. When base stations are positioned too close to one another, signals transmitted by a single radiotelephone are received by multiple base stations, interfering with radiotelephones in the other cells trying to use the same channel. Additionally, increasing the number of base stations positioned throughout a geographical area increases the cost of the cellular, communication system.

Existing cellular communication systems utilize a frequency modulation technique and the modulated, electromagnetic information signal formed thereby is continuously transmitted. Because the modulated, electromagnetic information signal is continuously generated, only one signal may be transmitted at a specific frequency at any particular time. When more than one signal is transmitted simultaneously at the same frequency, the signals interfere with one another.

Discrete modulation techniques have been developed which permit multiple transmissions at a single frequency. Suggestions have been made, therefore, to convert the information signal, prior to modulation thereof upon the electromagnetic wave, into a discrete, encoded signal. Two or more signals may be simultaneously transmitted by transmitting discrete portions of each of the signals in sequence in discrete bursts.

Discrete, encoded signals are modulated upon an electromagnetic wave by a composite modulation technique. The composite, modulation technique is a combination of amplitude and phase modulation wherein the information content of the composite modulated information signal formed thereby is contained in the amplitude and/or the phase variations of the signal.

Receivers, sometimes referred to as decoders, can be constructed with circuitry to permit reconstruction of a particular one, or each, of the several discrete, encoded signals transmitted at a particular frequency.

Because two or more information signals may be transmitted at the same frequency, the information-transmission capacity of the frequency band allocated for radiotelephone communication may be increased two-fold or greater.

However, because existing analog base stations defining the cells of a cellular communication system must be replaced with base stations capable of decoding discretely encoded information signals, conversion of the cellular, communication systems will occur gradually. As the cellular system base station infrastructure is gradually converted from analog receivers to discrete decoders, some of the channels of a cell of a cellular, communication system will comprise base station receivers having decoders for decoding the discretely encoded signals; other channels of a cell will comprise base station receivers having only existing, conventional analog demodulators. During this conversion period, a radiotelephone must be capable of transmitting both a frequency modulated information signal, and a composite modulated information signal. Therefore, the radiotelephone must contain circuitry to frequency modulate with a continuous wave information signal and to composite modulate with a discrete, encoded signal (the radiotelephone must additionally contain circuitry to encode an information signal into the discrete codes to form the discrete, encoded signal).

Once the information signal, or discrete, encoded signal is modulated upon an electromagnetic wave, the modulated information signal must be amplified to a power level suitable for transmission over extended distances. Conventionally, an analog information signal is modulated upon an electromagnetic wave by the above-described frequency modulation technique. Discrete, encoded information signals, however, are modulated upon an electromagnetic wave by a composite modulation technique which, as stated hereinabove, results in both amplitude modulation and phase modulation. An amplifier which amplifies a composite modulated signal (here, having the discretely encoded information signal modulated thereupon) must be operated in the linear mode in order to preserve the shape of the wave and the information contained therein. Conversely, an amplifier which amplifies a frequency modulated signal should be operated in the saturation mode in order to most efficiently amplify the signal.

A dual-mode radiotelephone permitting transmission of both conventional, frequency modulated signals, and composite modulated signals may be constructed having first circuitry for frequency modulation, and second circuitry for composite modulation of the discrete, encoded signals. A first amplifier may be included with the first circuitry, and constructed to be in a saturation mode, in order to most efficiently amplify the frequency modulated signal. A second amplifier may be included with the second circuitry, and constructed to be in a linear mode, in order to amplify accurately the composite modulated signal.

However, the dimensions of the radiotelephone must be minimized in order to minimize the radiotelephone size. Minimization of the number of circuit parts permits minimization of the radiotelephone size.

Therefore, a radiotelephone operable in both an analog (frequency modulation) and a discrete mode (composite modulation) having a single amplifier for amplifying both a frequency modulated signal and an amplitude modulated signal would be advantageous. However, because the amplifier must be operated in the linear mode to amplify a composite modulated signal, and in a saturation mode to amplify efficiently a frequency modulated signal, existing radiotelephone constructions having a single linear amplifier would operate to transmit an analog, frequency modulated electromagnetic signal very inefficiently.

What is needed, therefore, is amplifying apparatus which may be alternately operated in the linear mode and the saturation mode to efficiently transmit either a composite modulated signal or a frequency modulated signal.

SUMMARY OF THE INVENTION

It is, accordingly, an object of the present invention to provide amplifying apparatus operable in either a linear mode or a saturation mode.

It is a further object of the present invention to provide radiotelephone amplifier circuitry operable in either a linear mode or a saturation mode.

It is a yet further object of the present invention to provide radiotelephone amplifier circuitry operable in a linear mode when a composite modulated signal is to be transmitted by the radiotelephone, and in the saturation mode when a frequency modulated signal is to be transmitted by the radiotelephone.

It is a still further object of the present invention to provide radiotelephone amplifier circuitry selectably operable in a linear mode or a saturation mode responsive to signals supplied thereto by a processor.

In accordance with the present invention, therefore, an amplifying apparatus for converting an input signal into an amplified, output signal is disclosed. The amplifying apparatus comprises an amplifier having an input and an output for amplifying characteristics of the input signal supplied to the input of the amplifier to generate thereby the amplified, output signal, wherein the amplifier may be operated in either a saturation mode or a linear mode.

BRIEF DESCRIPTION OF THE DRAWINGS

The present invention will be better understood when read in light of the accompanying drawings in which:

FIGS. 2A and 2B are graphical representations of constant envelope signals wherein FIG. 2A is a graphical representation of a frequency modulated signal representative of one such signal that may be amplified by the amplifying apparatus of the present invention, and FIG. 2B is a graphical representation of a phase modulated signal representative of another such signal that may be amplified by the amplifying apparatus of the present invention;

DESCRIPTION OF THE PREFERRED EMBODIMENTS

An information signal, such as, for example, a voice signal or a data signal, may be transmitted over large distances by combining the information signal and an electromagnetic wave of a frequency suitable for transmission over large distances. The process of combining the information signal and the electromagnetic wave is referred to as modulation. As mentioned hereinabove, various techniques have been developed to modulate the information signal upon the electromagnetic wave.

Figure 1:
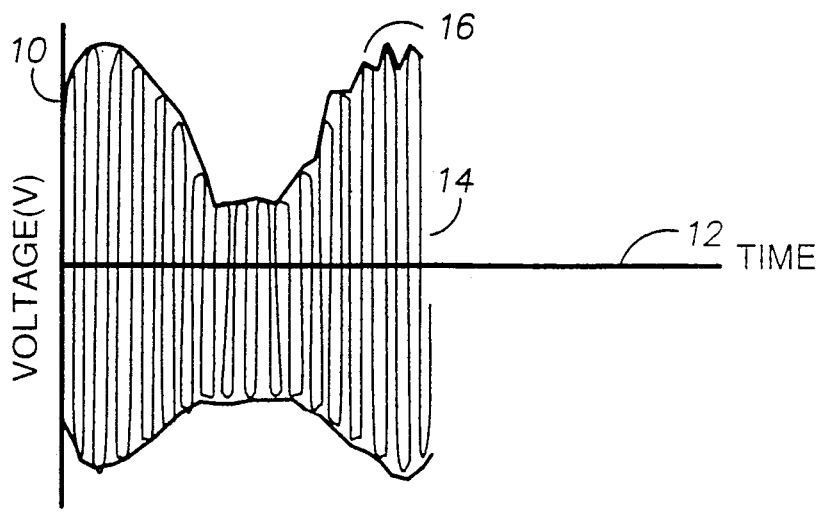
FIG. 1 is a graphical representation of an amplitude modulated electromagnetic signal representative of one such signal that may be amplified by the amplifying apparatus of the present invention.

FIG. 1 is a graphical representation of a modulated, electromagnetic information signal in which an information signal is modulated upon an electromagnetic wave. The waveform is actually a plot of voltage, scaled in terms of volts on ordinate axis 10, as a function of time, plotted along abscissa axis 12 The waveform 14, illustrated in FIG. 1 is an amplitude-modulated signal as the amplitude (i.e., voltage) of the electromagnetic wave 14, referred to as the carrier wave, varies responsive to the value of the information signal modulated thereupon. The amplitude of wave 14, referred to as the envelope, and illustrated by curve 16 in the Figure, is, thus, the information-containing portion of wave 14. Carrier wave 14 is characterized by a specific frequency, referred to as the carrier frequency. A receiver constructed to receive an amplitude-modulated signal, such as wave 14, detects, or otherwise recreates the amplitude, i.e., the envelope 16, of the waveform 14 to determine thereby the information signal.

Figure 2A:
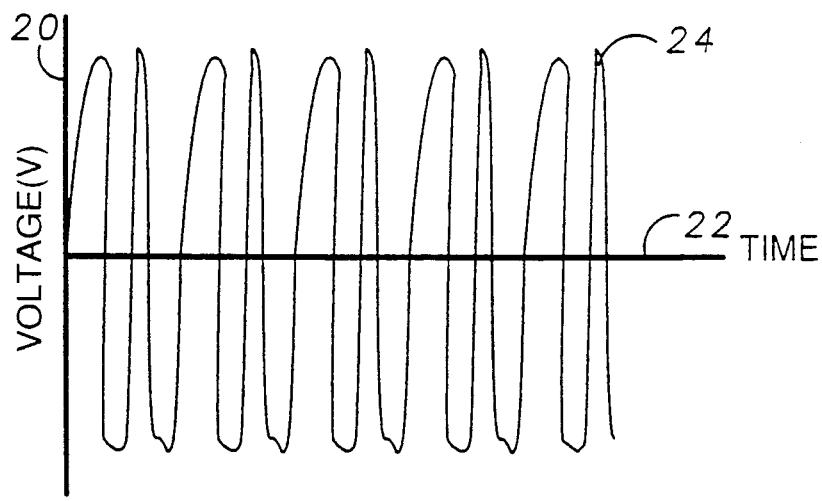

FIG. 2A is a graphical representation of a modulated electromagnetic information signal in which an information signal is modulated upon an electromagnetic wave to form a constant envelope signal. The waveform is actually a plot of voltage, scaled in terms of volts on ordinate axis 20, as a function of time plotted along abscissa axis 22. The waveform 24 illustrated in FIG. 2A is a frequency modulated signal as the frequency of the wave 24 varies responsive to the value of the information signal modulated thereupon. The frequency variation of the signal is, thus, the information-containing portion of wave 24. The frequency variation of wave 24 caused by modulation of the information signal thereupon is slight, however, compared to the frequency of the electromagnetic wave prior to modulation thereof. Hence, the wave 24, once modulated, may be said to be characterized by the frequency of the unmodulated wave, referred to as the carrier frequency. A receiver constructed to receive a frequency modulated signal, such as wave 24, detects, or otherwise recreates the frequency variations of the waveform 24 to determine thereby the information signal.

Figure 2B:
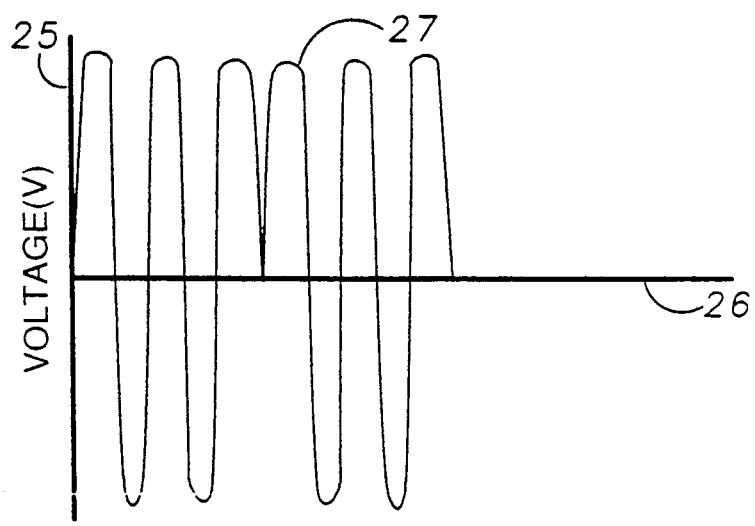

FIG. 2B is a graphical representation of a modulated electromagnetic information signal in which an information signal is modulated upon an electromagnetic wave to form a constant envelope signal. The waveform is actually a plot of voltage, scaled in terms of volts on ordinate axis 25, as a function of time plotted along abscissa axis 26. The waveform 27 illustrated in FIG. 2B is a phase modulated signal as the phase of the wave varies responsive to the value of the information signal modulated thereupon. The phase variation is, thus, the information-containing portion of wave 27. It is to be noted that the abrupt phase change of waveform 27 of FIG. 2B is for purposes of illustration only, and that an actual phase modulated signal would exhibit a gradual phase change. Because the phase variation of waveform 27 does not alter the frequency of the signal, wave 27, once modulated, may be said to be characterized by the frequency of the unmodulated wave, referred to as the carrier frequency. A receiver constructed to receive a phase modulated signal, such as wave 27, detects, or otherwise recreates the phase variations of the waveform 27 to detect thereby the information signal.

Once an information signal is modulated upon an electromagnetic wave by one of the modulation techniques, the modulated signal must be amplified to transmit the modulated signal over large distances. Because the information content of an amplitude modulated signal is contained within the amplitude of the generated signal, the shape of the waveform must be preserved. Hence, the amplification process must be linear, i.e., the amplifier must be operated in a linear mode. Conversely, because the information content of a frequency modulated signal is not contained within the amplitude of the generated signal, the shape of the waveform need not be preserved. Hence, the amplification process need not be linear, i.e., the amplifier, for efficient operation, should be operated in a saturation mode.

Figure 3:
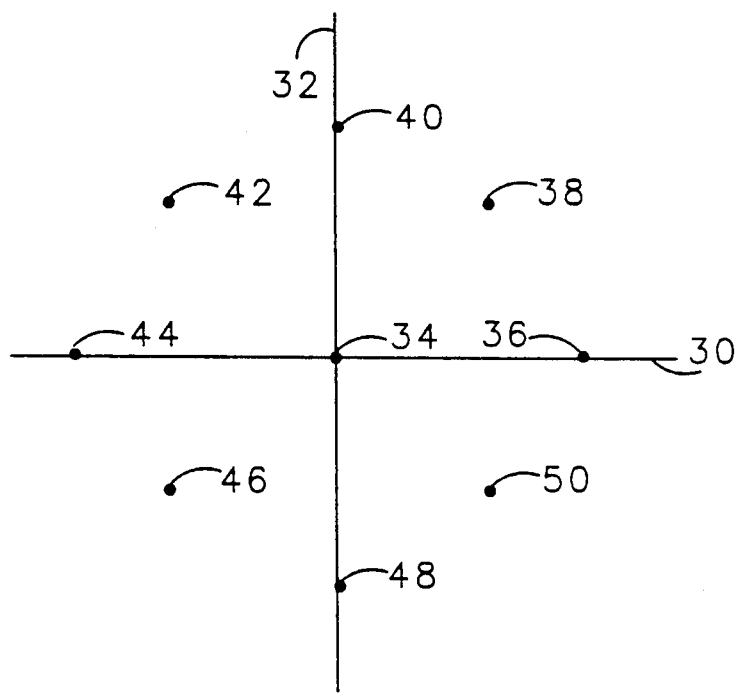
FIG. 3 is a graphical representation of a discrete encoding scheme for encoding signals which may be modulated upon an electromagnetic wave and amplified by the amplifying apparatus of the present invention.

Turning now to the graphical representation of FIG. 3, a discrete encoding scheme for encoding an information signal is illustrated. Other encoding schemes are similarly possible. By encoding an information signal into a discrete encoded signal, transmission of more than one signal is permitted at a particular carrier frequency by time division multiple access techniques. The graph of FIG. 3 is defined by abscissa axis 30 and ordinate axis 32 which are scaled in terms of cos (wt) and sin (wt), respectively, wherein w refers to angular frequency and t refers to time. The respective axes 30-32 intersect at origin 34. FIG. 3 illustrates a pi/4, differential, quaternary phase shift keying (DQPSK) encoding scheme. The illustrated DQPSK encoding scheme is the standard selected for digital, cellular telephone communication systems to be implemented in the United States. In this scheme a discrete signal may take the form of any of eight different values (i.e., vector positions), each of which is defined by points 36-50. A vector extending between origin 34 and each point 36-50 represents a particular discrete signal. A discrete signal, represented by such a vector, may be modulated upon an electromagnetic wave characterized by a particular carrier frequency. Vectors representing various ones of the points 36-50 (and, hence, discrete signal levels) may be sequentially modulated upon an electromagnetic carrier wave to transmit thereby information which is encoded in the DQPSK. With particular respect to the United States standard for digital, cellular communications, transitions from any position defined by points 36-50 are only allowed to points that are plus or minus forty-five degrees or plus or minus one hundred thirty-five degrees away. Such a limitation minimizes decoding error of a decoder which receives and decodes a transmitted electromagnetic signal.

For example, if a current signal value may be represented by a vector formed between origin 34 and point 40, an allowable, succeeding signal value would be represented by a vector extending between origin 34 and points 38, 42, 46, or 50. Because transitions between successive signal values may be any of four signal values, a transition between successive signal values may be represented by a two-bit binary code.

Existing cellular, communication systems transmit frequency modulated signals, such as waveform 24 of FIG. 2A. For reasons described more fully hereinabove, proposals have been made to implement radiotelephone communication systems wherein information signals are encoded into discrete signals according to a given encoding scheme. The encoded signals are then modulated upon a carrier frequency electromagnetic wave by a composite modulation technique to form a composite modulated signal with both amplitude and phase variation.

As previously mentioned, amplifying apparatus which amplifies a composite modulated signal must be operated in the linear mode to preserve the amplitude of the modulated waveform. However, existing radiotelephones which generate frequency modulated signals contain amplifying apparatus which is operated in the saturation mode. Because radiotelephones which transmit discrete, encoded information signals must also be capable of transmitting (and receiving) conventional, frequency modulated signals, radiotelephone designs permitting both transmission of frequency modulated signals and transmission of composite modulated signals require separate amplifiers to amplify the two types of signals. Alternatively, a single amplifier operating in the linear mode, when amplifying a frequency modulated signal, operates inefficiently and with significant heat generation and excessive current drain.

Figure 4:
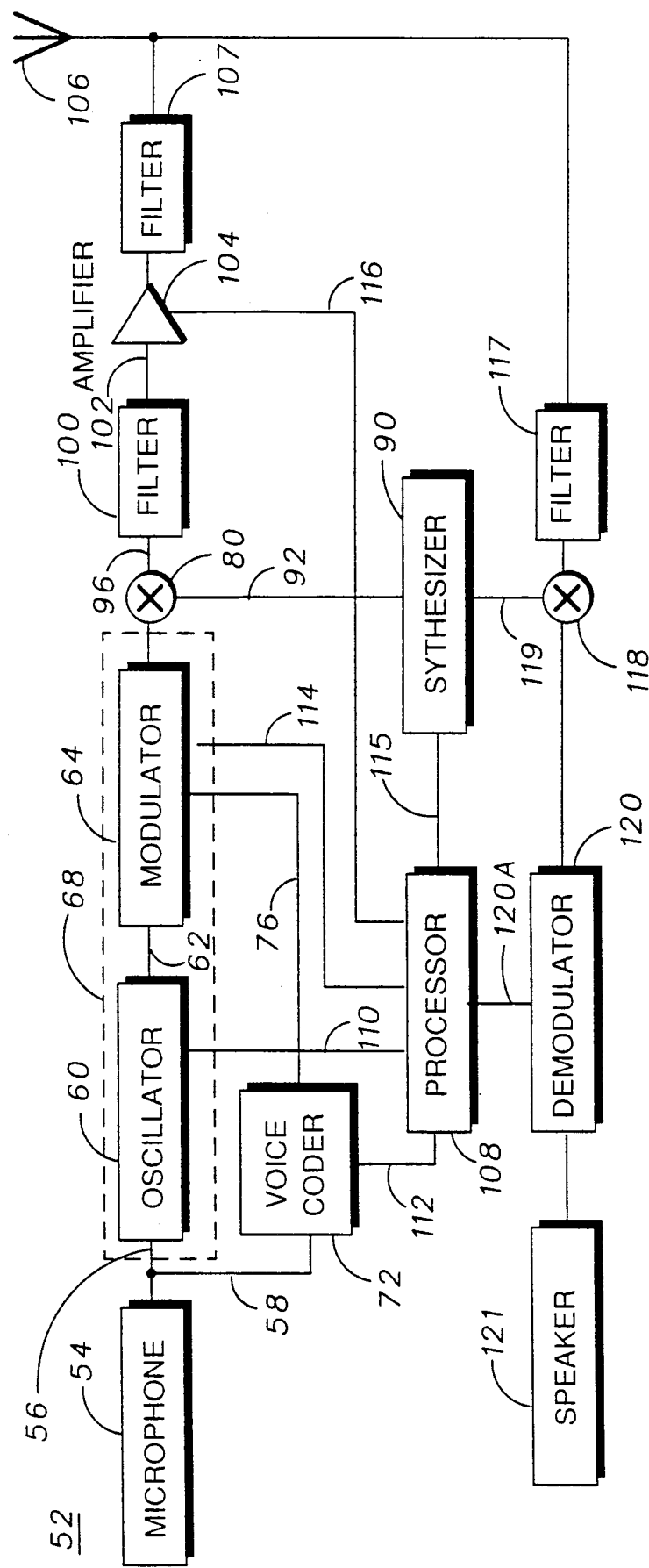
FIG. 4 is a block diagram of a preferred construction of a radio transmitter comprising the amplifying apparatus of the present invention.

FIG. 4 illustrates a block diagram of a radio transmitter, referred to generally by reference numeral 52, of the present invention. The actual circuitry embodying the functional blocks of the diagram may be disposed upon one or more circuit boards and housed within a conventional radiotelephone housing. The radio transmitter 52 requires only one amplifier by providing means to operate the amplifier in either a linear mode or a saturation mode. Efficient amplification of a frequency modulated signal, and amplification of an amplitude modulated signal having discrete, encoded signals modulated thereupon is thereby possible, while, at the same time, minimizing circuit size and cost.

Microphone 54 converts voice signals supplied thereto into an electrical, information signal, and generates an output indicative thereof on lines 56 and 58.

The information signal supplied on line 56 is utilized when, similar to conventional cellular, radiotelephone communications, a frequency modulated information signal is to be generated by radiotelephone 52. The information signal supplied on line 58 is utilized when a discrete, encoded signal modulated to form a composite modulated information signal is to be generated by radiotelephone 52.

The information signal generated on line 56 is supplied to voltage controlled oscillator (VCO) 60 whereat the information signal is combined with an oscillating signal of a certain frequency. A frequency modulated information signal is generated by voltage controlled oscillator 60 on line 62 to modulator 64. When radiotelephone 52 is to transmit a frequency modulated information signal, modulator 64 does not alter the frequency modulated information signal supplied thereto on line 62, but, rather, "passes-through" the frequency modulated information signal on line 66. Oscillator 60 and modulator 64 may together comprise a hybrid modulation apparatus, referred to by block 68, similar to the hybrid modulation apparatus disclosed in U.S. patent application Ser. No. 526,156, filed on May 21, 1990.

The information signal generated on line 58 is supplied to vocoder 72 whereat the analog information signal is digitized and encoded according to an encoding scheme, such as the encoding scheme of FIG. 3, and generates a discrete, encoded signal on line 76 which is supplied to modulator 64. Modulator 64 modulates the discrete, encoded signal supplied thereto on line 76 to form a composite, modulated information signal of a pre-determined frequency, and supplies the composite modulated information signal on line 66.

The modulated information signal supplied on line 66, either modulated according to a frequency modulation technique or a composite modulation technique, is supplied to mixer 80. Mixer 80 mixes the signal supplied thereto on line 66 with an offset transmission-frequency carrier wave generated by synthesizer 90 and supplied to mixer 80 on line 92. Mixer 80 mixes the modulated information signal supplied thereto on line 66 with the carrier wave supplied thereto on line 92. Mixer 80 generates a modulated information signal upon a carrier wave of a carrier frequency determined by the oscillating frequency of synthesizer 90 and 60 on line 96.

Line 96 is coupled to filter 100 which forms a passband of frequencies centered about, or close to, the carrier frequency of the transmitted wave. Filter 100 generates a filtered signal, containing the modulated information signal, on line 102 which is coupled to power amplifier 104. Amplifier 104 amplifies the modulated information signal supplied thereto to power levels adequate for transmission thereof through antenna 106. Prior to transmission of the amplified signal, and as illustrated, the amplified signal may be filtered by filter 107 which may, for example, form a portion of a duplexer. Filter 107 is positioned in-line between amplifier 104 and antenna 106

Processor 108 provides output signals on lines 110, 112, 114, and 115 to control operation of oscillator 60, vocoder 72, modulator 64, and synthesizer 90, respectively, to control modulation of the information signal generated by microphone 54.

Processor 108 controls whether the information signal generated by microphone 54 is modulated by oscillator 60 to form a frequency modulated information signal, or alternately, is encoded by vocoder 72 according to a discrete encoding scheme and modulated by modulator 64 to form a composite modulated information signal.

As the modulated signals supplied to amplifier 104, in the preferred embodiment, are frequency modulated or composite modulated information signals, processor 108 supplies a mode-of-operation selection signal to amplifier 104 on line 116 to cause operation of amplifier 104 in either a linear mode or a saturation mode.

Processor 108 supplies a mode-of-operation selection signal on line 116 to cause operation of amplifier 104 in the saturation mode when the modulated information signal supplied thereto is a frequency modulated information signal, and supplies a mode-of-operation selection signal to cause linear operation of amplifier 104 when the modulated information signal supplied thereto is a composite modulated information signal.

FIG. 4 further illustrates the radiotelephone 52 receive circuit for a signal transmitted to antenna 106. The signal transmitted to antenna 106 is supplied to filter 117 which passes signals of desired frequencies to mixer 118. Mixer 118 receives an oscillating signal from synthesizer 90 on line 119, and generates a mixed signal which is supplied to demodulator 120. Demodulator 120 supplies a demodulated, electrical information signal to speaker 121. Processor 108 may, and as illustrated, supply a signal to demodulator 120 on line 120A to control operation thereof. Speaker 121 converts the electrical information signal supplied thereto into audible signals.

Figure 5:
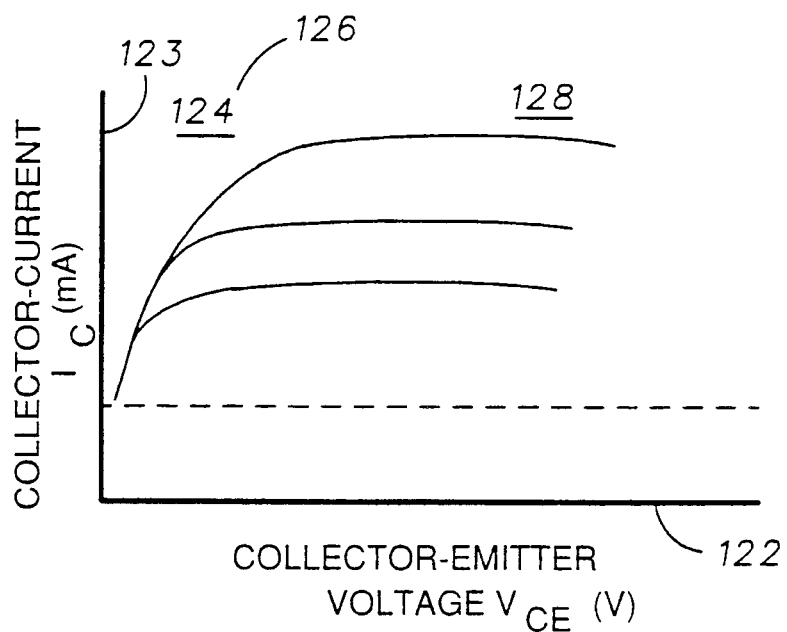
FIG. 5 is a graphical representation of a typical transistor characteristic curve illustrating linear and saturation areas of operation thereof.

Power amplifier 104 is preferably comprised of one or more transistors. FIG. 5 illustrates typical bipolar transistor characteristic curves of a transistor of a power amplifier, such as amplifier 104. The curves of FIG. 5 are formed by plotting transistor collector current as a function of collector to emitter voltage for varying base currents. Abscissa axis 122 is scaled in terms of volts and ordinate axis 123 is scaled in terms of milliamperes. At low collector to emitter voltages, an increase in base current does not cause a substantial increase in collector current. This region, referred to as the saturation region 124 is indicated in the graph of FIG. 5 to the left of the hatched line 126. As the collector to emitter voltage increases, collector current and base current become linearly related. This region is referred to as linear region 128. The mode-of-operation selection signal generated by processor 108 and supplied to amplifier 104 prevents (or permits) operation of the transistor component of the amplifier in the saturation region thereby causing linear operation (or saturation, i.e., nonlinear operation).

Figure 6:
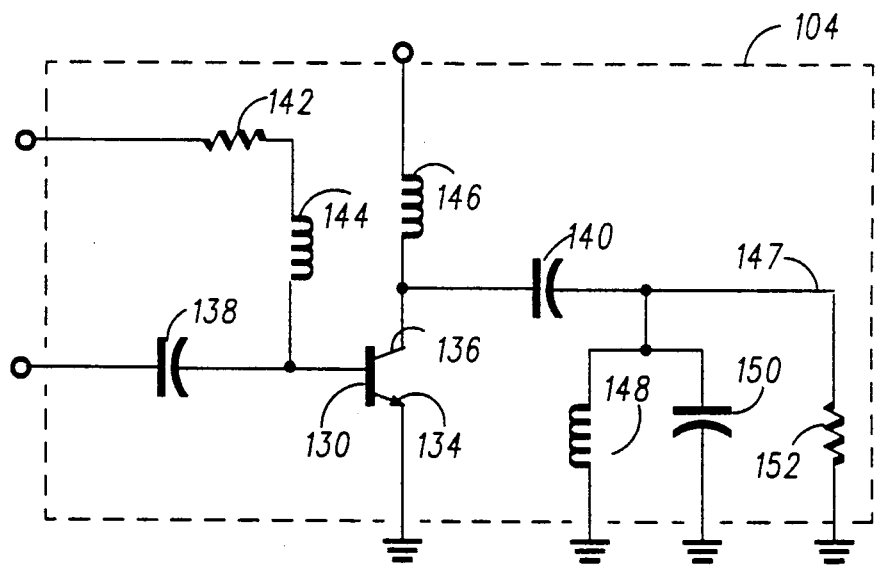
FIG. 6 is a circuit schematic diagram of a large signal amplifier comprising a portion of the preferred embodiment of the amplifying apparatus of the present invention.

Turning now to the circuit schematic of FIG. 6, there is shown an ideal, large signal amplifier, such as, for example a class AB amplifier, forming a portion of amplifier 104 of the preferred embodiment. Other large signal amplifiers may, of course, be similarly utilized. The class AB amplifier is comprised of transistor 130 having base leg 132, emitter leg 134 and collector leg 136. Capacitor 138 is coupled to base leg 132 of transistor 130, and capacitor 140 is coupled to collector leg 136 of the transistor 130. Collector leg 136 is coupled to node 137. Capacitors 138 and 140 are of values to form DC blocks. Resistor 142 and inductor 144 connected in series are also coupled to base leg 132 of transistor 130. Inductor 146 is coupled to collector leg 136. Inductors 144 and 146 function as chokes. Coupled to node 147 extending from a side of capacitor 140 is a parallel connection of inductor 148 and capacitor 150 connected at first sides thereof at node 147 and at second sides thereof to earth ground. LC combination 148-150 forms a resonant circuit. Resistor 152 is further connected at one side thereof at node 147. The filtered, modulated information signal passed by filter 100 on line 102 of FIG. 4 to amplifier 104 is supplied to base leg 132 through capacitor 138.

Figure 7:
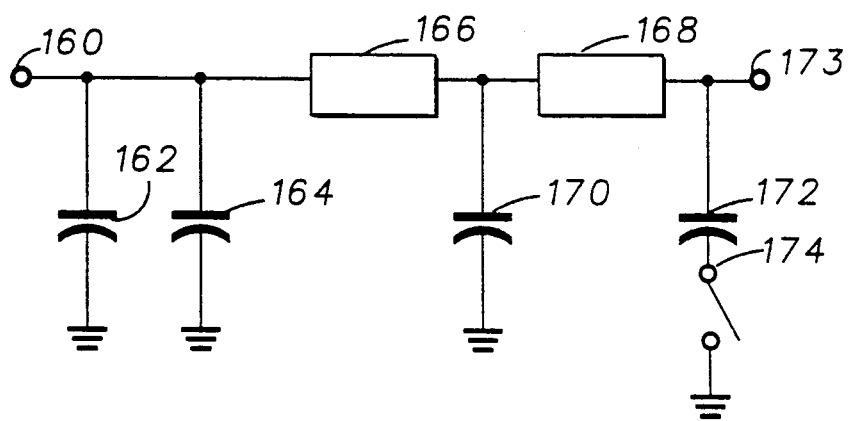
FIG. 7 is a partial block, partial circuit schematic illustration of load matching circuitry for altering a load impedance of an amplifier, such as the amplifier of FIG. 6.

Turning now to the partial block, partial schematic illustration of FIG. 7, there is shown a second portion of amplifier 104 shown in block form in FIG. 4. More particularly, FIG. 7 illustrates circuitry which permits operation of the amplifier in the linear mode or saturation mode, by causing, or preventing, saturation of transistor 130, shown in FIG. 6. The circuit of FIG. 7 is connected at node 137, and the circuit components of the circuit of FIG. 7 are substituted for elements 140, 148, and 150 of FIG. 6. An arbitrarily selected load impedance is substituted for resistor 152 and connected at node 173. The connection between the circuit of FIG. 7 and node 137 is indicated, for purposes of illustration, by connector 160. Capacitors 162 and 164 are connected between ground and node 137. A first side of complex impedance 166 is coupled to node 137, and a second side thereof is coupled to a first side of complex impedance 168, and also to capacitance 170 which extends between the second side of complex impedance 166 and ground. A second side of complex impedance 168 is coupled to capacitance 172 and to connector 173 which, similar to connector 160, is shown for purposes of illustration, permits connection of amplifier 104 to a load device such as antenna 106 of FIG. 4. Capacitors 162, 164, 170 and 172, complex impedances 166-168, and the load device together comprise a load impedance of a known value. This impedance, when suitably coupled at node 137 to transistor 130, causes operation of transistor 130 in either the linear mode or the saturation mode depending upon the values of the respective components 162-172. Proper selection of the component values of components 162-172 causes saturation of transistor 130, and, hence, operation of amplifier 104 in the saturation mode.

FIG. 7 further illustrates a PIN diode switch 174 positioned between capacitor 172 and ground. Opening of switch 174 disconnects capacitor 172 from the circuit of FIG. 7. When switch 174 is opened, capacitors 162, 164, and 170, impedances 166 and 168, and the impedance of the load element form the load impedance. Because switch 174 is open, capacitor 172 does not form a portion of the load circuit for amplifier 104. By proper selection of capacitor 172 (as well as the other component elements 162-168), saturation of transistor 130 when switch 174 is open, and linear operation of transistor 130 when switch 174 is closed can be effectuated. According to the preferred embodiment of the present invention, therefore, the mode-of-operation selection signal generated by processor 108 on line 116 is supplied to PIN diode switch 174 to actuate the switch into either the open or the closed position.

When a conventional, frequency modulated signal is to be transmitted by transmitter 52, processor 108 supplies signals to data source 54 and modulator 64 to cause the information signal generated by data source 54 on line 56, and modulated by oscillator 60 to be passed through modulator 64. Vocoder 72 is inhibited. Processor 108 also generates a mode-of-operation selection signal on line 116 to amplifier 104 to open switch 174 to saturate transistor 130, and cause thereby operation of amplifier 104 in the saturation mode.

Conversely, when transmitter 52 is to transmit discrete, encoded signals, processor 108 supplies signals to data source 54, vocoder 72, and modulator 64 to cause the information signal generated by data source 54 on line 58 to be digitized and coded by vocoder 72 and modulated by modulator 64. Processor 108 also generates a mode-of-operation selection signal on line 116 to amplifier 104 to cause closing of switch 174 to cause thereby operation of transistor 130, and, hence, amplifier 104, in the linear mode.

The radio transmitter 52 therefore requires only one amplifier 104 to efficiently transmit either a frequency modulated information signal, or a composite modulated information signal having discrete, encoded signals modulated thereupon.

Figure 8:
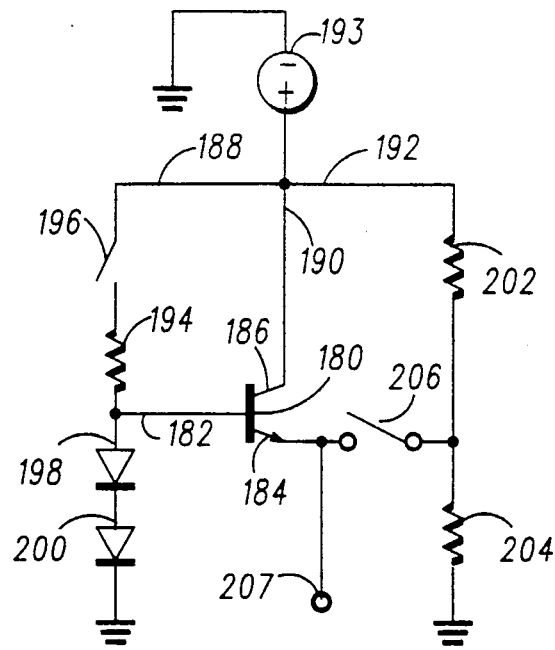
FIG. 8 is a circuit schematic illustration of biasing circuitry utilized to provide a bias current to an amplifier, such as the amplifier of FIG. 6 of the amplifying apparatus of the present invention.

Turning now to the circuit schematic of FIG. 8, there is shown an additional portion of the power amplifier 104 of the preferred embodiment of the present invention. The circuit of FIG. 8 may be utilized as an alternative to, or in addition to, the circuit of FIG. 7 to cause operation of amplifier 104 (in conjunction with the signal level) in either the saturation or the linear mode. The circuit of FIG. 8 includes transistor 180 having base leg 182, emitter leg 184, and collector leg 186. A steady voltage is supplied to branches 188, 190, and 192 by voltage source 193. Branch 190 is connected to collector leg 186 of transistor 180. Branch 188 is coupled to resistor 194 connected in series with transistor switch 196. A side of resistor 194 is coupled to base leg 182 of transistor 180, and to a first side of a series connection of diodes 198 and 200. Branch 192 is connected to a first side of a series connection of resistors 202 and 204. A second side of the series connection of diodes 198-200 extends to ground. A second side of the series connection of resistors 202-204 extends to ground. Transistor switch 206 is positioned between a second side of resistor 202 and the emitter leg 184 of transistor 180. Emitter leg 184 is connected to base leg 132 of transistor 130 of FIG. 6 through inductor 144, such connection is indicated, for purposes of illustration by connector 207. Switches 196-206 function such that closing of switch 196 opens switch 206, and closing of switch 206 opens switch 196. Similar to PIN diode switch 174 of FIG. 7, the mode-of-operation selection signal generated by processor 80 on line 108 actuates switches 196-206 to cause opening and closing thereof. Switches 196 and 206 may, for example, be comprised of conventional, dc switch elements.

When radio transmitter 52 is to transmit a frequency modulated signal, processor 108 generates signals to data source 54 and modulator 64 to cause the information signal generated by data source 54 on line 56, and modulated by oscillator 60, to be passed through modulator 64. Vocoder 72 is inhibited. Processor 108 provides a mode-of-operation selection signal on line 116 to cause operation of power amplifier 104 in the saturation mode by causing opening of switch 196 and closing of switch 206. When switch 196 is opened, no current is supplied to the base leg 182 of transistor 180, causing transistor 180 to turn (or remain) OFF.

The source voltage of voltage source 193 is supplied to the circuit path created by branch 192, resistor 202, and closed switch 206 to be supplied to the base leg 132 of transistor 130 or through inductor 144. This voltage assures bias near cutoff of transistor 130 to save additional current of amplifier 104 in the saturation mode. Conversely, when radio transmitter 52 is to transmit a composite modulated information signal, processor 108 generates signals to data source 54, vocoder 72, and modulator 64 to cause the information signal generated by data source 54 on line 58 to be digitized and coded by vocoder 72 and modulated by modulator 64. Processor 108 additionally generates a mode-of-operation selection signal on line 116 which is supplied to switches 196 and 206 to close switch 196 and open switch 206. Closing of switch 196 provides a circuit path for the supply current on path 188, switch 196 and resistor 194 to the base leg 182 of transistor 180 to turn the transistor ON. When transistor 180 is ON, a circuit path through path 190, across the collector 186 and emitter 184 legs of transistor 180 to be supplied to base leg 132 of transistor 130. This current biases transistor 130 and, hence, permits operation of amplifier 104, in the linear mode.

Figure 9:
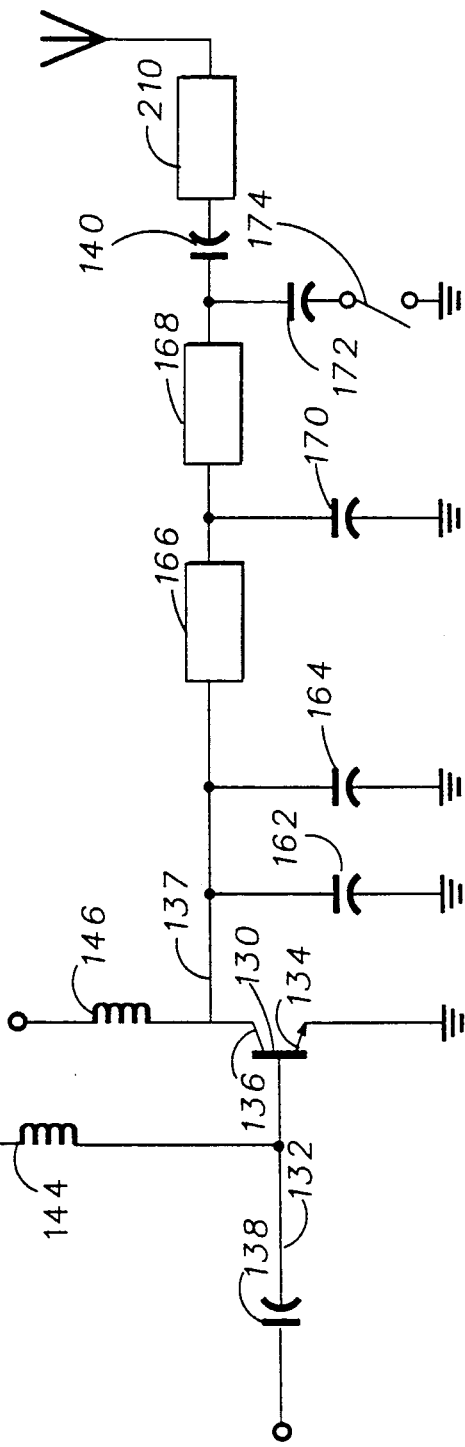
FIG. 9 is a partial block, partial circuit schematic illustration of the amplifying apparatus of the preferred embodiment of the present invention.
Figure 9:
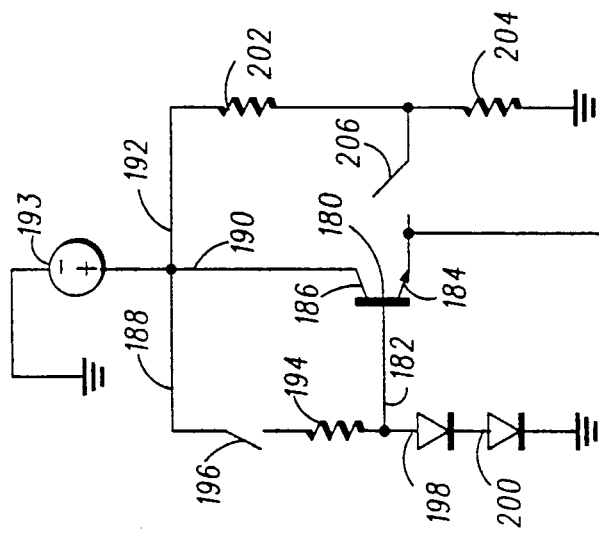

FIG. 9 illustrates a partial block, partial circuit schematic of the preferred embodiment of the amplifying apparatus of the present invention. FIG. 9 is a combination of FIG. 6, 7, and 8 and illustrates the preferred embodiment of the amplifier 104 of the present invention having both the load matching portion of FIG. 7 and the biasing circuitry of FIG. 8 to most advantageously cause operation of transistor 130 in either the linear or the saturation mode. It is noted that, in the preferred embodiment, the mode-of-operation selection signal causes opening and closing of switches 174, 196, and 206. FIG. 9 further illustrates duplex filter 210 forming a portion of the load circuitry.

Figure 10:
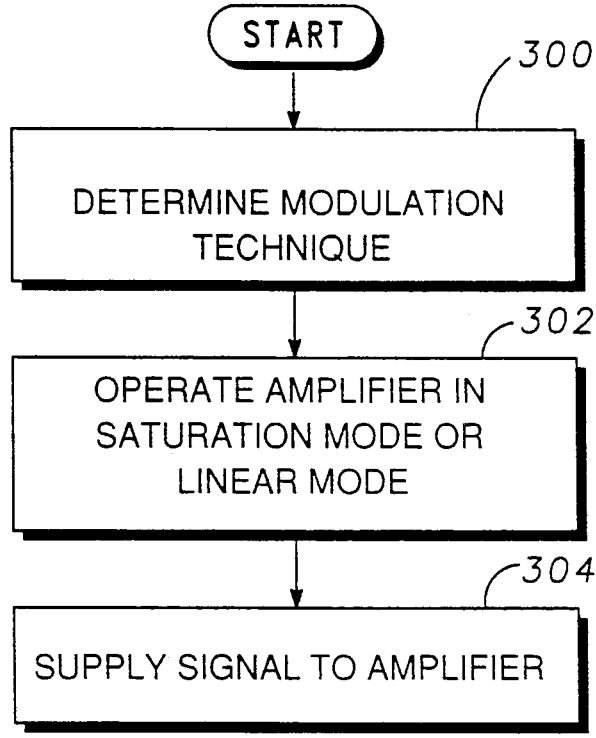
FIG. 10 is a logical, flow diagram of the method of the present invention.

Turning now to the flow diagram of FIG. 10, the method steps of the method of the present invention are illustrated. First, and as illustrated by block 300, the modulation technique by which the information signal is to be modulated is determined. Then, as illustrated by block 302, the amplifier is operated in either a linear mode or a saturation mode responsive to the modulation technique by which the information signal is modulated upon the carrier signal to amplify thereby the modulated signal. Third, and as illustrated by block 304, the modulated signal is supplied to an input of the amplifier.

While the present invention has been described in connection with the preferred embodiments shown in the various figures, it is to be understood that other similar embodiments may be used and modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. Amplifying apparatus for converting an input signal into an amplified, output signal, said amplifying apparatus comprising:

means forming an amplifier having an input and an output for amplifying characteristics of the input signal supplied to the input of the amplifier to generate thereby the amplified, output signal;

means forming a load element coupled to the output of the amplifier for receiving the amplified, output signal; and means for altering load characteristics of the load element to cause saturation of, or alternately, to prevent saturation of, the amplifier formed by the means for amplifying to operate the amplifier in the saturation mode or the linear mode, respectively.

2. The amplifying apparatus of claim 1 wherein said means for altering load characteristics alters the load characteristics of the load element to cause saturation of the amplifier formed by the means for amplifying when the input signal supplied to the input of the amplifier is a modulated signal having a constant envelope.

3. The amplifying apparatus of claim 2 wherein said modulated signal having the constant envelope comprises a frequency modulated signal.

4. The amplifying apparatus of claim 1 wherein said means for altering load characteristics alters the load characteristic of the load element to prevent saturation of the amplifier formed by the means for amplifying when the input signal supplied to the input of the amplifier is a composite modulated signal.

5. The amplifying apparatus of claim 4 wherein said composite modulated signal comprises discrete, encoded information signals modulated upon a carrier wave.

6. The amplifying apparatus of claim 1 further comprising a processing means for determining a modulation-type of the input signal supplied to the input of the amplifier wherein said processing means generates a mode-of-operation selection signal responsive to a determination of the modulation-type of the input signal.

7. The amplifying apparatus of claim 1 wherein said load characteristics altered by the means for altering comprise impedance characteristics of the load element.

8. The amplifying apparatus of claim 7 wherein said means for altering comprises a switch connected with at least one impedance element whereby actuation of said switch into a closed position connects the impedance element with the load element to alter thereby the impedance characteristics of the load element, and actuation of said switch into an open position disconnects the impedance element and the load element.

9. The amplifying apparatus of claim 8 wherein said switch is comprised of a PIN diode.

10. The amplifying apparatus of claim 8 wherein opening of said switch saturates the amplifier formed by the means for amplifying to cause operation thereof in the saturation mode.

11. The amplifying apparatus of claim 8 further comprising a processing means for determining a modulation-type of the input signal supplied to the input of the amplifier wherein said processing means generates a mode-ofoperation selection signal responsive to a determination of the modulation-type of the input signal.

12. The amplifying apparatus of claim 11 wherein said switch is actuated responsive to values of said mode-of-operation selection signal generated by the processing means.

13. The amplifying apparatus of claim 12 further comprising means for biasing the amplifier formed by the means for amplifying.

14. The amplifying apparatus of claim 13 wherein said means for biasing supplies a bias current to the amplifier formed by the means for amplifying.

15. The amplifying apparatus of claim 13 wherein said means for biasing comprises a biasing source connected in series with: a first bias circuit and a second bias circuit positioned in parallel therewith, and means for alternately connecting either said first bias circuit or said second bias circuit to the amplifier formed by the means for amplifying, such that said bias current is supplied to the amplifier through either the first bias circuit or said second bias circuit.

16. The amplifying apparatus of claim 15 wherein said means for alternately connecting is comprised of a means forming a switch.

17. The amplifying apparatus of claim 16 wherein said means forming the switch is actuated by said mode-of-operation selection signal generated by the processing means.

18. The amplifying apparatus of claim 1 wherein said amplifier formed by the means for amplifying comprises a large signal amplifier circuit.

19. A dual-mode radiotelephone operable to transmit either a frequency modulated signal or a composite modulated signal, said dualmode radiotelephone comprising:

means for selectively generating either a frequency modulated information signal or a composite modulated information signal;

means forming an amplifier having an input and an output for amplifying characteristics of either the frequency modulated information signal or the composite modulated information signal generated by said means for selectively generating supplied to the input of the amplifier to generate thereby an amplified, frequency modulated output signal, or an amplified, composite modulated output signal;

means forming load element circuitry coupled to the output of the amplifier for receiving the amplified, frequency modulated output signal, or the amplified, composite modulated output signal;

means for altering impedance characteristics of the load element circuitry to cause saturation of, or, alternately, to prevent saturation of the amplifier formed by the means for amplifying to operate the amplifier in a saturation mode or a linear mode, respectively.

20. The dual-mode radiotelephone of claim 19 wherein said amplifier formed by the means for amplifying is comprised of a large signal amplifier circuit.

21. The dual-mode radiotelephone of claim 19 further comprising a processing means for determining when the means for selectively generating generates the frequency modulated information signal, and when the means for selectively generating generates the composite modulated information signal.

22. The dual-mode radiotelephone of claim 21 wherein said processing means generates a mode-of-operation selection signal responsive to a determination of times when the means for generating generates a frequency modulated signal or a composite modulated signal.

23. The dual-mode radiotelephone of claim 19 wherein said load element circuitry further comprises a transmission antenna.

24. The dual-mode radiotelephone of claim 19 wherein said load element circuitry further comprises a filter element.

25. The dual-mode radiotelephone of claim 24 wherein said filter element comprises a duplex filter.

26. The dual-mode radiotelephone of claim 19 wherein said means for altering comprises a PIN diode forming a switch connected in series with an impedance element whereby actuation of the switch into a closed position connects the impedance element with the load element circuitry to alter thereby the impedance of the load element circuitry, and actuation of the switch into an open position disconnects the impedance element from the load element circuitry.

27. The dual-mode radiotelephone of claim 26 wherein opening of the switch causes saturation of the amplifier to cause operation thereof in the saturation mode.

28. The dual-mode radiotelephone of claim 19 further comprising means for biasing the amplifier formed by the means for amplifying.

29. The dual-mode radiotelephone of claim 28 wherein said means for biasing comprises a bias current source connected in series with: a first bias circuit and a second bias circuit positioned in parallel therewith, and means for alternately connecting either said first bias circuit or said second bias circuit to the amplifier formed by the means for amplifying, such that said bias current is supplied to the amplifier through either the first bias circuit or said second bias circuit.

30. Circuitry for a radiotelephone operable to transmit either a frequency modulated information signal or a composite modulated information signal formed by a signal generator, said circuitry comprising:
   means forming an amplifier having an input and an output for amplifying characteristics of either the frequency modulated information signal or the composite modulated information signal supplied to the input of the amplifier to generate thereby an amplified, frequency modulated information signal, or an amplified, composite modulated information signal;
   means forming a load element coupled to the output of the amplifier for receiving the amplified, frequency modulated signal, or the amplified, composite modulated signal formed by the amplifier;
   means for altering impedance characteristics of the load element to cause saturation of, or, alternately, to prevent saturation of, the amplifier formed by the means for amplifying to operate the amplifier in the saturation mode or the linear mode, respectively;
   means for biasing the amplifier formed by the means for amplifying to increase the saturation of, or, alternately, to increase linearity of, the amplifier formed by the means for amplifying;
   means for actuating said means for altering and said means for biasing to cause operation of said amplifier formed by the means for amplifying in either the saturation mode or the linear mode; and
   processing means for determining when the signal supplied to the input of the amplifier is a frequency modulated information signal or a composite modulated information signal, and for generating a mode-of-operation selection signal responsive to a determination thereof, wherein said mode-of-operation selection signal is supplied to said means for actuating.

31. A method for amplifying a modulated signal comprised of an information signal modulated upon a carrier signal by a modulation technique, said method comprising the steps of:
   determining the modulation technique by which the information signal is modulated upon the carrier signal;
   operating an amplifier in either a linear mode or a saturation mode by altering load characteristics of a load element coupled to the amplifier responsive to a determination of the modulation technique by which the information signal is modulated upon the carrier signal; and
   supplying the modulated signal to an input of the amplifier.

32. The method of claim 31 wherein said step of operating comprises operating the amplifier in the saturation mode when the modulated signal has a constant envelope.

33. The method of claim 32 wherein said modulated signal having a constant envelope comprises a frequency modulated signal.

34. The method of claim 31 wherein said step of operating comprises operating the amplifier in the linear mode when the modulated signal is a composite modulated signal.

35. The method of claim 34 wherein said composite modulated signal comprises discrete, encoded information signals modulated upon a carrier wave.

36. The method of claim 35 wherein the modulation technique determined during said step of determining is determined by a processing means.

37. The method of claim 36 wherein said processing means generates a mode-of-operation selection signal responsive to a determination of the modulation technique by which the information signal is modulated upon the carrier signal.

38. The method of claim 34 wherein said composite modulated signal comprises a differential quaternary phase shift keying modulated information signal.

39. The method of claim 31 including the further step of altering levels of a bias current supplied to the amplifier.

40. Amplifying apparatus having a processor operative to control amplification gain characteristics thereof, whereby said amplifying apparatus amplifies an input signal according to the amplification gain characteristics controlled by the processor to form thereby an amplified, output signal, said amplifying apparatus comprising:
   means forming an amplifier having an input and an output for amplifying characteristics of the input signal supplied to the input of the amplifier to generate thereby the amplified, output signal;
   means forming a load element coupled to the output of the amplifier formed by the means for amplifying for receiving the amplified, output signal generated by the amplifier;

means for altering load characteristics of the load element to cause saturation of, or, alternately, to prevent saturation of, the amplifier formed by the means for amplifying to operate the amplifier in the saturation mode or the linear mode, respectively, whereby the processor determines a modulation-type of the input signal supplied to the input of the amplifier, and whereby the processor generates a mode-of-operation selection signal responsive to a determination of the modulation-type of the input signal.

41. The amplifying apparatus of claim 40 wherein said means for altering causes operation of the amplifier formed by the means for amplifying in the saturation mode when the input signal supplied to the input thereof is a modulated signal having a constant envelope.

42. The amplifying apparatus of claim 40 wherein said means for altering causes operation of the amplifier formed by the means for amplifying in the linear mode when the input signal supplied to the input thereof is a composite modulated signal.

43. The amplifying apparatus of claim 40 wherein said load characteristics altered by the means for altering comprises impedance characteristics of the load element.

44. The amplifying apparatus of claim 43 wherein said means for altering comprises a switch connected with at least one impedance element whereby actuation of said switch into a first position connects the impedance element with the load element to alter thereby the impedance characteristics of the load element, and actuation of said switch into a second position disconnects the impedance element and the load element.

45. The amplifying apparatus of claim 44 wherein said switch is actuated responsive to values of said mode-of-operation selection signal generated by the processing means.

46. Amplifying apparatus for converting an input signal into an amplified, output signal, said amplifying apparatus comprising:

means forming an amplifier having an input and an output for amplifying characteristics of the input signal supplied to the input of the amplifier to generate thereby the amplified, output signal;

means forming a load element coupled to the output of the amplifier for receiving the amplified, output signal; and means for biasing the amplifier formed by the means for amplifying, said means for biasing formed of a first bias circuit and a second bias circuit positioned in parallel therewith, and means for alternately connecting either said first bias circuit or said second bias circuit to the amplifier formed by the means for amplifying such that application of a bias current to the first bias circuit when the first bias circuit is connected to the amplifier causes operation of the amplifier in the saturation mode, and such that application of the bias current to the second bias circuit when the second bias circuit is connected to the amplifier causes operation of the amplifier in the linear mode.

47. The amplifying apparatus of claim 46 wherein said means for alternately connecting connects the first bias circuit to the amplifier when the input signal supplied to the amplifier is a modulated signal having a constant envelope.

48. The amplifying apparatus of claim 47 wherein said modulated signal having the constant envelope comprises a frequency modulated signal.

49. The amplifying apparatus of claim 46 wherein said means for alternately connecting connects the second bias circuit to the amplifier when the input signal supplied to the amplifier is a composite modulated signal.

50. The amplifying apparatus of claim 49 wherein said composite modulated signal comprises discrete, encoded information signals modulated upon a carrier wave.

51. The amplifying apparatus of claim 46 further comprising a processing means for determining a modulation-type of the input signal supplied to the input of the amplifier wherein said processing means generates a mode-ofoperation selection signal responsive to a determination of the modulation-type of the input signal.

52. The amplifying apparatus of claim 51 wherein said means for alternately connecting is comprised of a means forming a switch.

53. The amplifying apparatus of claim 52 wherein said means forming the switch is actuated by said mode-of-operation selection signal generated by the processing means.

54. The amplifying apparatus of claim 46 wherein said amplifier formed by the means for amplifying comprises a large signal amplifier circuit.

* * * * *